(12) United States Patent
Chang et al.

(10) Patent No.: US 8,058,185 B2
(45) Date of Patent: Nov. 15, 2011

(54) METHOD OF FABRICATING SEMICONDUCTOR INTEGRATED CIRCUIT DEVICE

(75) Inventors: Dong-ryul Chang, Suwon-si (KR);
Tae-jung Lee, Yongin-si (KR);
Sung-hoan Kim, Suwon-si (KR);
Soo-cheol Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 593 days.

(21) Appl. No.: 11/977,039

(22) Filed: Oct. 23, 2007

(65) Prior Publication Data

US 2008/0057689 A1 Mar. 6, 2008

Related U.S. Application Data

(62) Division of application No. 11/429,370, filed on May 5, 2006, now Pat. No. 7,304,387.

(30) Foreign Application Priority Data

Jun. 8, 2005 (KR) .................. 10-2005-0049016

(51) Int. Cl.
*H01L 23/29* (2006.01)
(52) U.S. Cl. ................ 438/791; 257/E23.118
(58) Field of Classification Search ........... 438/791, 438/792, 786; 257/E23.118, E21.293
See application file for complete search history.

(56) References Cited

U.S. PATENT DOCUMENTS

| | | | |
|---|---|---|---|
| 5,541,125 A * | 7/1996 | Williams et al. ............. 438/202 |
| 6,057,081 A | 5/2000 | Yunogami et al. |
| 6,614,684 B1 | 9/2003 | Shukuri et al. |
| 6,670,710 B2 | 12/2003 | Matsunaga |
| 6,713,231 B1 | 3/2004 | Hasegawa et al. |
| 6,737,322 B2 | 5/2004 | Inoue et al. |
| 7,202,549 B2 | 4/2007 | Hashimoto et al. |
| 2002/0175415 A1 | 11/2002 | Matsunaga |
| 2003/0017698 A1 | 1/2003 | Ikeda |
| 2003/0166320 A1 | 9/2003 | Kasuya |
| 2003/0194841 A1 | 10/2003 | Inoue et al. |
| 2004/0166696 A1 | 8/2004 | Lee |
| 2004/0191989 A1 * | 9/2004 | Ngo et al. ............. 438/257 |
| 2004/0238920 A1 | 12/2004 | Hashimoto et al. |
| 2005/0112826 A1 * | 5/2005 | Chen et al. ............. 438/286 |
| 2006/0001104 A1 | 1/2006 | Ookura |

FOREIGN PATENT DOCUMENTS

| | | |
|---|---|---|
| CN | 1388582 A | 1/2003 |
| JP | 2001-93979 | 4/2001 |
| KR | 1998-0087543 | 12/1998 |
| KR | 10-0308497 | 8/2001 |
| TW | 405174 B | 9/2000 |
| TW | 480608 B | 3/2002 |

OTHER PUBLICATIONS

Chinese Office Action dated Sep. 11, 2009, issued in corresponding Chinese Application No. 200610091601.3.

\* cited by examiner

*Primary Examiner* — Bradley K Smith
*Assistant Examiner* — Amar Movva
(74) *Attorney, Agent, or Firm* — Onello & Mello LLP

(57) ABSTRACT

Provided are a semiconductor integrated device and a method for fabricating the same. The semiconductor integrated circuit includes a semiconductor substrate including a first dopant, a first conductive layer pattern formed on the semiconductor substrate, an interlayer dielectric layer formed on the first conductive layer pattern, a second conductive layer pattern formed on the interlayer dielectric layer, and a first vacuum ultraviolet (VUV) blocking layer which blocks a VUV ray radiated to the semiconductor substrate.

14 Claims, 12 Drawing Sheets

METHOD OF FABRICATING SEMICONDUCTOR INTEGRATED CIRCUIT DEVICE

This application is a divisional of U.S. application Ser. No. 11/429,370, filed on May 5, 2006 which claims priority to Korean Patent Application No. 10-2005-0049016 filed on Jun. 8, 2005, in the Korean Intellectual Property Office, the contents of which are incorporated herein by reference in their entirety.

BACKGROUND OF THE INVENTION

1. Field of the Invention

The present invention relates to a semiconductor integrated circuit device and a method for fabricating the same, and more particularly, this application relates to a semiconductor integrated circuit device having an improved operating characteristic and a method for fabricating the same.

2. Description of the Related Art

Semiconductor integrated circuit devices such as a system-on-chip (SOC), a microcontroller unit (MCU), and a display driver IC (DDI) include a plurality of peripheral devices such as a processor, a memory, a logic circuit, an audio and image processing circuit, and various interface circuits. Thus, the semiconductor integrated circuit devices include transistors having various driving voltages. For example, a high voltage (15-30V) driving transistor, an intermediate voltage (4-6V) driving transistor, and a low voltage (1-3V) driving transistor may be included in a semiconductor integrated circuit device.

In particular, in order for a high voltage driving transistor to operate normally even when a high voltage is applied, a breakdown voltage between a drain region of the high voltage driving transistor and a semiconductor substrate should be sufficiently high. Thus, a heavily doped region of the drain region and a gate electrode are sufficiently spaced apart to increase the breakdown voltage, and the doping concentration of a lightly doped region of the drain region and the semiconductor substrate are reduced to enlarge a depletion region. Accordingly, the thickness of a gate insulating layer of the high voltage driving transistor is larger than that of a gate insulating layer of the low voltage driving transistor.

After the high voltage driving transistor is manufactured, a back-end process of forming a multi-layered interconnection line and a multi-layered insulating layer is performed. A subsequent process is usually a plasma process such as conductive layer etching or photoresist layer ashing. Vacuum ultraviolet (VUV) rays are generated during the plasma process to irradiate the semiconductor substrate, and thus positive electric charges (or negative electric charges) are deposited on a gate insulating layer and/or a device isolation layer. Since the doping concentration of the lightly doped region of the drain region and the semiconductor substrate are low, a small change in electrical charges caused by the VUV rays causes a significant change in the characteristic of the high voltage driving transistor.

For example, in the case of an NMOS high voltage driving transistor, positive electrical charges deposited on a gate insulating layer form a channel under the gate insulating layer, thereby increasing a drain-off current (Idoff). In addition, positive electrical charges deposited on a device isolation layer form an inversion layer on the device isolation layer and a P-well interface and generate an isolation current (Isol) between a drain region and an N-well of an adjacent PMOS high voltage driving transistor, thereby reducing an isolation effect.

SUMMARY OF THE INVENTION

The present invention provides a semiconductor integrated circuit device having an improved operating characteristic.

The present invention also provides a method for fabricating a semiconductor integrated circuit device having an improved operating characteristic.

The above stated objects as well as other objects, features and advantages, of the present invention will become clear to those skilled in the art upon review of the following description.

According to an aspect of the present invention, there is provided a semiconductor integrated device comprising: a semiconductor substrate including a first dopant; a first conductive layer pattern formed on the semiconductor substrate; an interlayer dielectric layer formed on the first conductive layer pattern; a second conductive layer pattern formed on the interlayer dielectric layer; and a first vacuum ultraviolet (VUV) blocking layer formed on the second conductive layer pattern and the interlayer dielectric layer to block a VUV ray irradiated to the semiconductor substrate.

In another embodiment, the semiconductor integrated circuit can further comprise a first oxide layer under the first VUV blocking layer.

In another embodiment, the first VUV blocking layer is formed of a material having a smaller band gap than silicon oxide.

In another embodiment, the first VUV blocking layer comprises nitride.

In another embodiment, the first VUV blocking layer is a SiN layer or a SiON layer.

In another embodiment, the first conductive layer pattern is a gate electrode of a high voltage driving transistor.

In another embodiment, the high voltage driving transistor includes source/drain regions which are comprised of a lightly doped region including a second dopant and a highly doped region, the lightly doped region being arranged at the gate electrode, formed in the semiconductor substrate and being of a different conductive type from the semiconductor substrate and the highly doped region spaced a predetermined interval apart from the gate electrode, formed shallower than the lightly doped region, and being of a different conductivity type from the semiconductor substrate.

In another embodiment, the dopant concentration of the first dopant is in a range of $1 \times 10^{15} - 1 \times 10^{17}$ atoms/cm$^3$.

In another embodiment, the dopant concentration of the second dopant is in a range of $1 \times 10^{14} - 1 \times 10^{16}$ atoms/cm$^3$.

In another embodiment, the semiconductor integrated circuit can further comprise an intermetallic dielectric layer formed on the first VUV blocking layer through plasma deposition.

In another embodiment, the intermetallic dielectric layer includes a first dielectric layer and a second dielectric layer that are sequentially formed, the first dielectric layer having better gap-fill characteristic than the second dielectric layer.

In another embodiment, the semiconductor integrated circuit can further comprise a third conductive layer pattern formed on the intermetallic dielectric layer and a second VUV blocking layer formed on the entire surface of the third conductive layer pattern and the intermetallic dielectric layer to block the VUV ray irradiated to the semiconductor substrate.

In another embodiment, the semiconductor integrated circuit can further comprise a second oxide layer under the second VUV blocking layer.

In another embodiment, the second VUV blocking layer is formed of a material having a smaller band gap than silicon oxide.

According to another aspect of the present invention, there is provided a method for fabricating a semiconductor integrated circuit, the method comprising forming a first conductive layer pattern on a semiconductor substrate including a first dopant, forming an interlayer dielectric layer on the first conductive layer pattern, forming a second conductive layer pattern on the interlayer dielectric; and forming a first vacuum ultraviolet (VUV) blocking layer on the entire surface of the second conductive layer pattern and the dielectric layer to block a VUV ray irradiated to the semiconductor substrate.

In another embodiment, the method for fabricating a semiconductor integrated circuit can further comprises forming a first oxide layer under the first VUV blocking layer.

In another embodiment, the first VUV blocking layer is formed of a material having a smaller band gap than silicon oxide.

In another embodiment, the first VUV blocking layer comprises nitride.

In another embodiment, the first VUV blocking layer is a SiN layer or a SiON layer.

In another embodiment, the first conductive layer pattern is a gate electrode of a high voltage driving transistor.

In another embodiment, the high voltage driving transistor includes source/drain regions which are comprised of a lightly doped region including a second dopant and a highly doped region, the lightly doped region being arranged at the gate electrode, formed in the semiconductor substrate and being of a different conductivity type from the semiconductor substrate and the highly doped region spaced a predetermined interval apart from the gate electrode, formed shallower than the lightly doped region, and being of a different conductivity type from the semiconductor substrate.

In another embodiment, the dopant concentration of the first dopant is in a range of $1 \times 10^{15}$-$1 \times 10^{17}$ atoms/cm$^3$.

In another embodiment, the dopant concentration of the second dopant is in a range of $1 \times 10^{14}$-$1 \times 10^{16}$ atoms/cm$^3$.

In another embodiment, the method for fabricating a semiconductor integrated circuit can further comprise forming an intermetallic dielectric layer on the first VUV blocking layer through plasma deposition.

In another embodiment, the intermetallic dielectric layer includes a first dielectric layer and a second dielectric layer that are sequentially formed, the first dielectric layer having better gap-fill characteristic than the second dielectric layer.

In another embodiment, the method for fabricating a semiconductor integrated circuit can further comprise forming a third conductive layer pattern on the intermetallic dielectric layer and a second VUV blocking layer on the surface of the third conductive layer pattern and the intermetallic dielectric layer to block the VUV ray irradiated to the semiconductor substrate.

In another embodiment, the method for fabricating a semiconductor integrated circuit can further comprise forming a second oxide layer under the second VUV blocking layer.

In another embodiment, the second VUV blocking layer is formed of a material having a smaller band gap than silicon oxide.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Advantages and features of the present invention and methods of accomplishing the same may be understood more readily by reference to the following detailed description of preferred embodiments and the accompanying drawings.

Herein, a high voltage driving transistor is a transistor to which a driving voltage of 15-30V is applied and a low voltage driving transistor is a transistor to which a driving voltage of 3V or less is applied. However, it is obvious that a specific value of the driving voltage can be readily changed by those skilled in the art.

Figure 1:
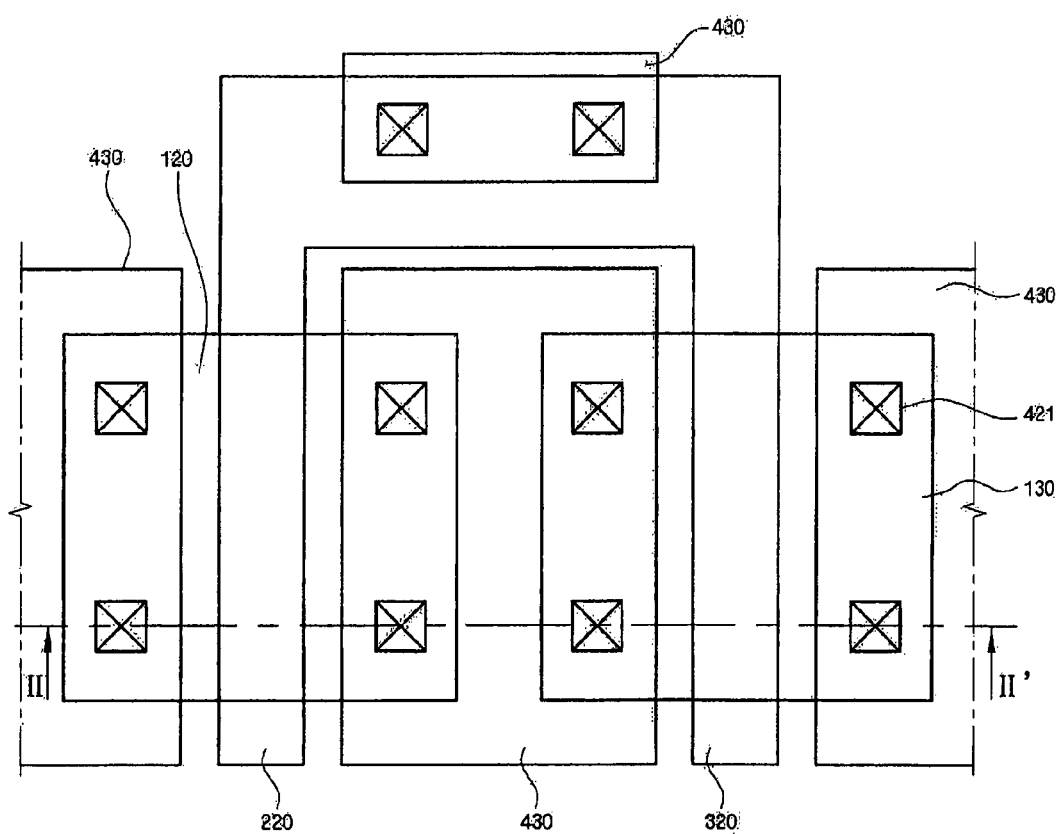
FIG. 1 is a layout of a semiconductor integrated circuit device according to a first embodiment of the present invention.
Figure 2:
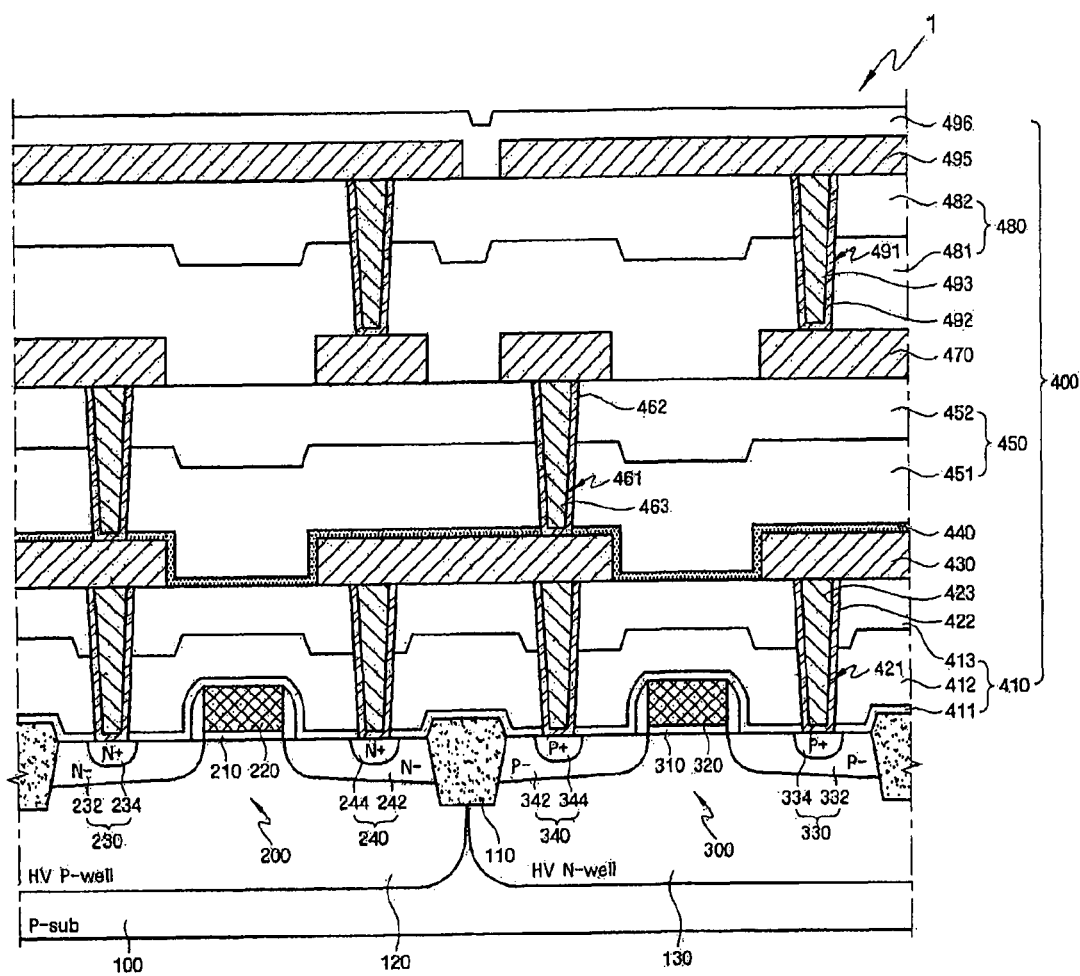
FIG. 2 is a cross-sectional view taken along line II-II' in FIG. 1.

FIG. 1 is a layout of a semiconductor integrated circuit device according to a first embodiment of the present invention. FIG. 2 is a cross-sectional view taken along line II-II' in FIG. 1. Herein, a semiconductor integrated circuit device may be, but is not limited to, an inverter of a display driver IC (DDI).

Referring to FIGS. 1 and 2, a semiconductor integrated circuit device 1 according to a first embodiment of the present invention includes a semiconductor substrate 100 having a first dopant, an NMOS high voltage driving transistor 200, a PMOS high voltage driving transistor 300, and an upper-level layer structure 400.

The semiconductor substrate 100 may be a silicon substrate, a SOI (Silicon on Insulator) substrate, a gallium arsenic substrate, a silicon germanium substrate, a ceramic substrate, a quartz substrate, or a glass substrate for a display device. The semiconductor substrate 100 is usually a P-type substrate and a P-type epitaxial layer may be grown on the semiconductor substrate 100.

A device isolation layer 110 formed on the semiconductor substrate 100 defines an active region. An isolation layer may be a shallow trench isolation (STI) or a field oxide isolation (FOX) formed by a local oxidation (LOCOS) process.

A P-well 120 and an N-well 130 may be formed to obtain a high voltage driving transistor in the semiconductor substrate 100. In particular, the dopant concentration of a well used in a high voltage driving transistor is lower than that of a well used in a low voltage driving transistor. For example, the concentration of the first dopant of the P-well 120 and/or the N-well 130 may be in a range of $1 \times 10^{15}$-$1 \times 10^{17}$ atom/cm$^3$.

The NMOS high voltage transistor 200 includes a gate electrode 220, a gate insulating layer 210, a source region 230, and a drain region 240.

The gate electrode 220 is a conductive layer pattern extended in a specific direction on the semiconductor substrate 100 and is insulated from the semiconductor substrate 100 through the gate insulating layer 210. The gate insulating layer 210 is usually made of silicon oxide ($SiO_x$). In particular, the thickness of a gate insulating layer of a high voltage driving transistor is larger than that of a gate insulating layer of a low voltage driving transistor. For example, the gate insulating layer 210 of the NMOS high voltage transistor 200 may have a thickness of 200-400 Å and a gate insulating layer of a low voltage transistor may have a thickness of 30-150 Å. That is, the gate insulting layer of the low voltage driving transistor is thin, thereby increasing the driving speed of a semiconductor device, and the gate insulating layer 210 of the NMOS high voltage transistor 200 is thick, thereby having a sufficiently high proof stress level at a high voltage of 15V or higher.

The source region 230 and the drain region 240 are arranged at both sidewalls of the gate electrode 220. In particular, the source region 230 and the drain region 240 of the NMOS high voltage driving transistor 200 forms a mask islanded double diffused drain (MIDDD) structure for high voltage driving. That is, lightly doped regions 232 and 242 having a second dopant are arranged in the gate electrode 220, and thus are formed in the semiconductor substrate 100, and heavily doped regions 234 and 244 are spaced apart from the gate electrode 220 by a predetermined interval and are formed shallower than the lightly doped regions 232 and 242. A breakdown voltage can be increased when the heavily doped regions 234 and 244 to which a high voltage is applied are spaced apart from the gate electrode 220 by a sufficiently large interval.

In particular, the dopant concentration of the lightly doped regions 232 and 242 of the NMOS high voltage driving transistor 200 are lower than those of lightly doped regions used in a low voltage driving transistor. For example, the concentration of the first dopant in the lightly doped regions 232 and 242 may be in a range of $1 \times 10^{14}$-$1 \times 10^{16}$ atom/cm$^3$. As such, if the P-well 120 and the lightly doped regions 232 and 242 are lightly doped, the width of a depletion region at boundaries between the P-well 120 and the lightly doped regions 232 and 242 increases. Since a breakdown voltage sufficiently increases, a stable operation is possible even when a high voltage is applied to the drain region 240.

Although the source region 230 and the drain region 240 form an MIDDD structure in the first embodiment of the present invention, they may have a lightly diffused drain (LDD) structure, a mask LDD (MLDD) structure, or a lateral double-diffused MOS (LDMOS) structure as long as they are suitable for high voltage driving.

The PMOS high voltage driving transistor 300 includes a gate electrode 320, a gate insulating layer 310, a source region 330, and a drain region 340. The PMOS high voltage driving transistor 300 is complementary to the NMOS high voltage driving transistor 200 and an explanation thereof will not be given.

The upper-level layer structure 400 includes an interlayer dielectric layer 410, a contact 423, a first interconnection line 430, a first vacuum ultraviolet (VUV) blocking layer 440, a first intermetallic dielectric layer 450, a first via 463, a second interconnection line 470, a second intermetallic dielectric layer 480, a second via 493, a third interconnection line 495, and a passivation layer 496.

The interlayer dielectric layer 410 is formed on the NMOS high voltage driving transistor 200, the PMOS high voltage driving transistor 300, and the semiconductor substrate 100. The interlayer dielectric layer 410 is formed of a low dielectric constant dielectric material. By using a low dielectric constant dielectric material for the interlayer dielectric layer 410, may be at least one selected from the group consisting of, for example, a flowable oxide (FOX) layer, a torene silazene (TOSZ) layer, a undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer, a plasma enhanced oxide, and a stack layer of these layers. The overall dielectric constant of an interconnection line of the semiconductor integrated circuit device 1 and a resistance-capacitance (RC) delay can be reduced.

In the first embodiment of the present invention, the interlayer dielectric layer 410 includes a PEOX layer 411, a BPSG layer 412, and a PETEOS layer 413. Here, the PEOX layer 411 is used as a buffer layer and the BPSG layer 412 has a superior gap-fill characteristic and thus reduces a step caused by the gate electrodes 220 and 320. The PETEOS layer 413 provides superior throughput and thus, the interlayer dielectric layer 410 can be formed fast to a predetermined thickness.

The contact 423 is formed in a predetermined region of the interlayer dielectric layer 410 to electrically connect the source/drain regions 230, 240, 330, 340, the gate electrodes 220 and 320 of the NMOS and PMOS high voltage driving transistors 200 and 300 and the first interconnection line 430. The contact 423 may be formed of a metal material such as copper, titanium, or tungsten.

In addition, a first barrier pattern 422 may be formed around the contact 423 to prevent a material of the contact 423 from being diffused to the interlayer dielectric layer 410. The first barrier pattern 422 may be formed of Ti, TiN, Ti/TiN, Ta, TaN, Ta/TaN, or Ta/TiN.

The first interconnection line 430 is formed on the interlayer dielectric layer 410 and is a conductive layer pattern connected to the source/drain regions 230, 240, 330, 340, the gate electrodes 220 and 320 of the NMOS and PMOS high voltage driving transistors 200 and 300. The first interconnection line 430 may be formed of aluminum to a thickness of about 5000 Å. Although not shown, when the first interconnection line 430 is an aluminum interconnection line, an adhesion film may be further formed of Ti/TiN between the first interconnection line 430 and the contact 423 to improve the adhesion between the first interconnection line 430 and the contact 423, and an anti-reflection coating film may be further formed of Ti, TiN, or Ti/TiN on the first interconnection line 430 to prevent a diffuse reflection of aluminum during a photolithography process.

In the first embodiment of the present invention, the first interconnection line 430 serves for applying a ground voltage to the source region 230 of the NMOS high voltage driving transistor 200, a power supply voltage to the source region 330 of the PMOS high voltage driving transistor 300, and a predetermined signal voltage to the drain region 240 of the NMOS high voltage driving transistor 200 and the drain region 340 of the PMOS high voltage driving transistor 300.

The first VUV blocking layer 440 is formed on the entire surface of the first interconnection line 430 and the interlayer dielectric layer 410 and blocks VUV rays irradiated to the semiconductor substrate 100. The first VUV blocking layer 440 is formed of a material having a smaller band gap than silicon oxide ($SiO_x$). The gate insulating layers 210 and 310 and/or the device isolation layer 110 are formed mainly of silicon oxide ($SiO_x$). Thus, when a VUV ray having greater energy than the band gap of silicon oxide ($SiO_x$) is irradiated, an electron-hole pair (EHP) is formed and positive electric charges and/or negative electric charges are accumulated on the gate insulating layers 210 and 310 and/or the device isolation layer 110. The deposited positive electric charges and/or negative electric charges increase a drain-off current (Idoff) and an isolation current (Isol). Since the first VUV blocking layer 440 formed above the gate insulating layers 210 and 310 and the device isolation layer 110 are formed of a material having a smaller band gap than silicon oxide ($SiO_x$), the VUV ray can be absorbed before arriving at the gate insulating layers 210 and 310 and the device isolation layer 110.

A material having a smaller band gap than silicon oxide ($SiO_x$) may be, but is not limited to, a nitride layer or, in particular, a SiN layer or SiON layer. The SiN layer may be formed to a thickness of 50 Å or more because of having a better VUV absorption characteristic than the SiON layer, and the SiON layer may be formed to a thickness of 500 Å or more. In addition, VUV absorption is improved as the thickness of the SiN layer or the SiON layer increases, but the thickness of the SiN layer or the SiON layer may be adjusted according to the characteristic of the semiconductor integrated circuit device 1.

In addition, when the first VUV blocking layer 440 is a nitride layer, it can block external ions or moisture from entering the semiconductor substrate 100. The first intermetallic dielectric layer 450 and the second intermetallic dielectric layer 480 formed on the first VUV blocking layer 440 may include external ions or moisture due to a manufacturing process. The external ions or moisture may be diffused and deposited on the gate insulating layers 210 and 310 and/or the device isolation layer 110. The deposited external ions or moisture increase the drain-off current (Idoff) and the isolation current (Isol). Since the first VUV blocking layer 440 can block the external ions or moisture before the external ions or moisture arrive at the gate insulating layers 210 and 310 and/or the device isolation layer 110, the drain-off current (Idoff) and the isolation current (Isol) can be reduced.

The first intermetallic dielectric layer 450 is formed on the first VUV blocking layer 440. The first intermetallic dielectric layer 450 has a low dielectric constant dielectric material, and may be at least one material selected from the group consisting of, for example, a flowable oxide (FOX) layer, a torene silazene (TOSZ) layer, a undoped silicate glass (USG) layer, a borosilicate glass (BSG) layer, a phosphosilicate glass (PSG) layer, a borophosphosilicate glass (BPSG) layer, a plasma enhanced tetraethylorthosilicate (PE-TEOS) layer, a fluoride silicate (FSG) layer, a high density plasma (HDP) layer, a plasma enhanced oxide, and a stack layer of these layers. The overall dielectric constant of an interconnection line of the semiconductor integrated circuit device 1 and a resistance-capacitance (RC) delay can be reduced.

In the first embodiment of the present invention, an HDP layer 451 and a PETEOS layer 452 are sequentially deposited. In one embodiment, the HDP layer 451 and the PETEOS layer 452 are formed by plasma deposition. Plasma deposition is advantageous in that deposition can be performed at low temperature. Although VUV rays may be irradiated when using plasma, the first VUV blocking layer 440 absorbs the radiated VUV rays, thereby preventing the semiconductor integrated circuit device 1 from being damaged by the irradiated VUV rays.

In addition, the first intermetallic dielectric layer 450 may include external ions or moisture, but the first VUV blocking layer 440 absorbs the external ions or moisture, thereby preventing the semiconductor integrated circuit device 1 from being damaged by the external ions or moisture.

The HDP layer 451 has a superior gap-fill characteristic and thus reduces a step generated by the first interconnection line 430. The PETEOS layer 452 provides superior throughput and thus, the first intermetallic dielectric layer 450 can be formed quickly to a predetermined thickness.

The first via 463 is formed in a predetermined region of the first intermetallic dielectric layer 450 to electrically connect the first interconnection line 430 and the second interconnection line 470. The first via 463 may be formed of a metal material such as copper, titanium, or tungsten. A second barrier pattern 462 is formed around the first via 463 to prevent a material of the first via 463 from being diffused to the first intermetallic dielectric layer 450.

The second interconnection line 470 is formed on the first intermetallic dielectric layer 450 and is electrically connected to the first interconnection line 430. The second interconnection line 470 may be formed mainly of aluminum. The second intermetallic dielectric layer 480 is formed of a low dielectric constant material on the second interconnection line 470. The second via 493 is formed in a predetermined region of the second intermetallic dielectric layer 480 to electrically connect the second interconnection line 470 and the third interconnection line 495. The passivation layer 496 is formed on the third interconnection line 495 to protect the semiconductor integrated circuit device 1.

FIGS. 3A through 4B are views that illustrate the effect of the semiconductor integrated circuit device according to the first embodiment of the present invention. Here, FIGS. 3A and 4A indicate a case where the semiconductor integrated circuit device 1 does not include the first VUV blocking layer 440 and FIGS. 3B and 4B indicate a case where the semiconductor integrated circuit device 1 includes the first VUV blocking layer 440.

Figure 3A:
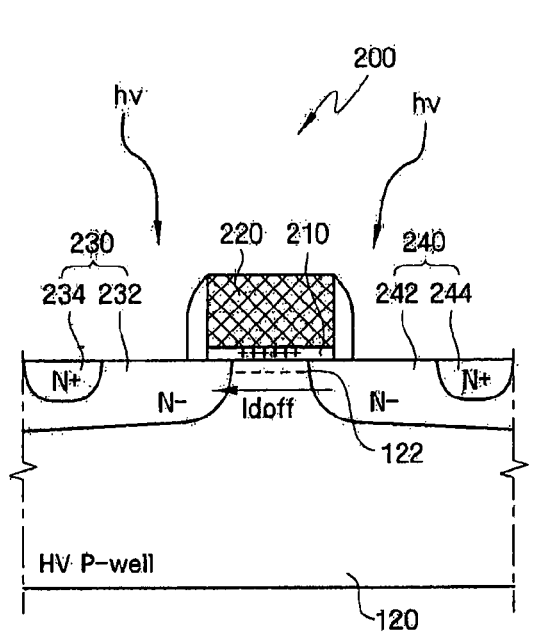
FIGS. 3A through 6B are views that illustrate the effect of the semiconductor integrated circuit device according to the first embodiment of the present invention.
Figure 3B:
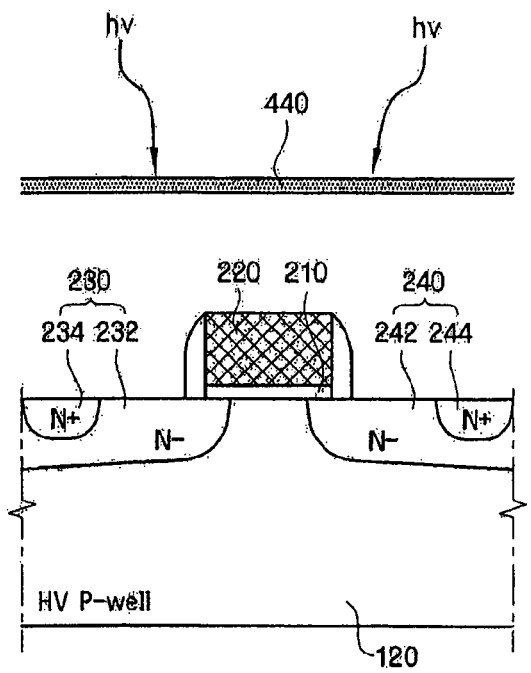

Referring to FIGS. 3A and 3B, if a VUV ray is irradiated to the semiconductor integrated circuit device 1, positive electric charges are accumulated on the gate insulating layer 210 of the NMOS high voltage driving transistor 200. Once positive electric charges are accumulated on the gate insulating layer 210, negative electric charges are accumulated on the surface of the P-well 120, thereby forming an inversion layer 122. In particular, the inversion layer 122 can be easily formed because the P-well 120 of the NMOS high voltage driving transistor 200 has low dopant concentration. Thus, a drain-off current Idoff can be generated without a voltage greater than a threshold voltage being applied to the gate electrode 220.

Figure 4A:
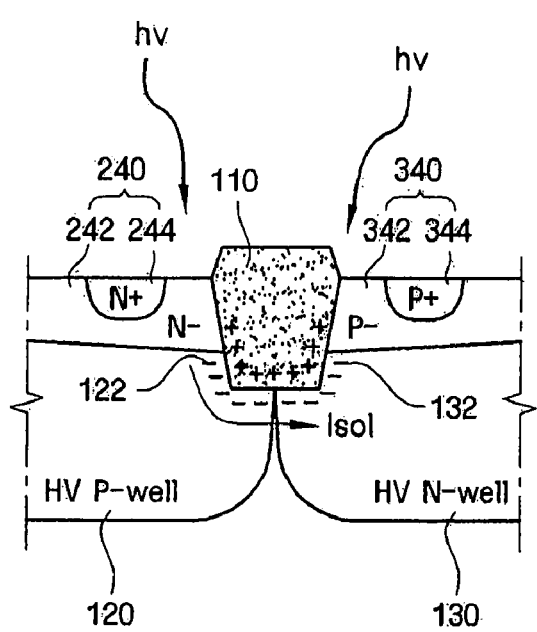
Figure 4B:
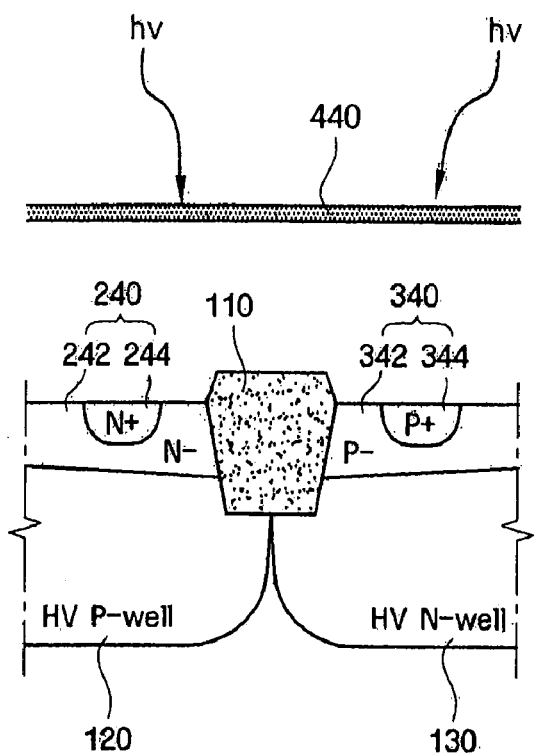

On the other hand, since the irradiated VUV ray is absorbed by the first VUV blocking layer 440 in FIGS. 3B and 4B, positive electric charges are not accumulated on the gate insulating layer 210 of the NMOS high voltage driving transistor 200. As a result, the drain-off current Idoff is not generated.

Referring to FIGS. 4A and 4B, once the VUV ray is irradiated to the semiconductor integrated device 1 of FIG. 4A, positive electric charges are accumulated on the device isolation layer 110 of the NMOS high voltage driving transistor and the PMOS high voltage driving transistor (see 200 and 300 of FIG. 2). More specifically, when the device isolation layer 110 is a silicon oxide ($SiO_x$) layer, if the VUV ray has an energy greater than the band gap of the silicon oxide layer, an electron hole pair is formed and positive electric charges are accumulated on the device isolation layer 110 adjacent to the P-well 120 and the N-well 130. When positive electric charges are accumulated on the device isolation layer 110, negative electric charges are accumulated on the surfaces of the P-well 120 and the N-well 130 adjacent to the device isolation layer 110. Thus, the inversion layer 122 is formed in the P-well 120 and an accumulation layer 132 in which positive electric charges are accumulated is formed in the N-well 130. Since the P-well 120 and the N-well 130 have low dopant concentration, the inversion layer 122 and the accumulation layer 132 can be easily formed. Thus, an isolation current Isol may be formed through the inversion layer 122 between the drain region 230 of the NMOS high voltage driving transistor 200 and an N-well of the PMOS high voltage driving transistor 300. As a result, the isolation between the NMOS high voltage driving transistor 200 and the PMOS high voltage driving transistor 300 is degraded.

On the other hand, since the irradiated VUV ray is absorbed by the first VUV blocking layer 440 in FIG. 4B, positive electric charges are not accumulated on the device isolation layer 110 that electrically isolates the NMOS high voltage driving transistor 200 and the PMOS high voltage driving transistor 300. As a result, an isolation current Isol is not generated.

Although only the case where the VUV ray is irradiated and thus positive electric charges are accumulated on the gate insulating layer 210 and the device isolation layer 110 is described in FIGS. 3 and 4, it is obvious to those skilled in the art that negative electric charges can also be accumulated by a substrate bias voltage applied to a semiconductor substrate. Thus, it is also obvious that a drain-off current Idoff and an isolation current Isol may be generated in the similar way when negative electric charges are accumulated.

Figure 5A:
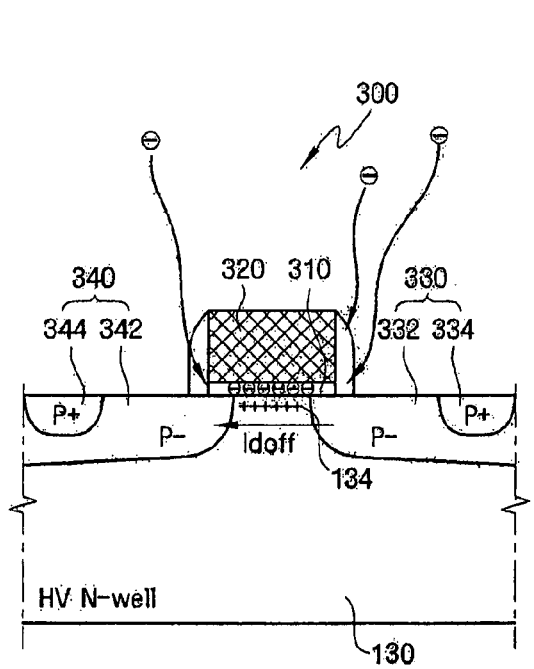
Figure 5B:
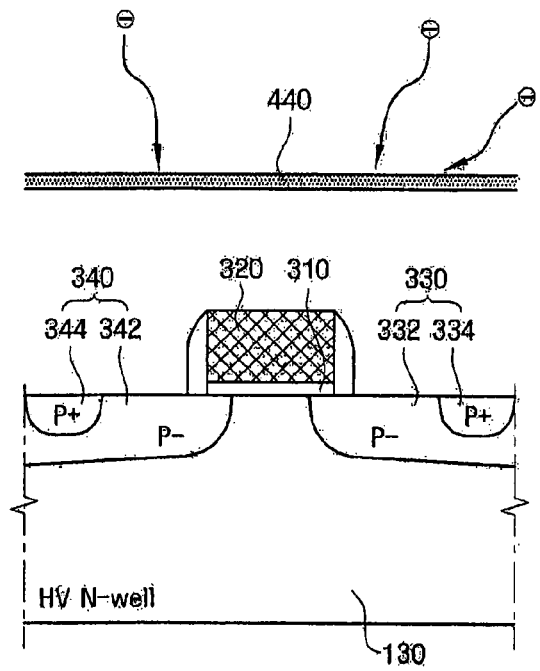
Figure 6A:
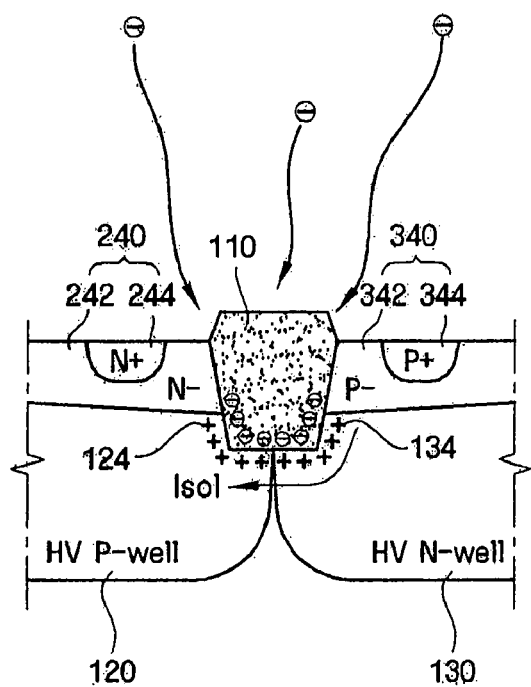
Figure 6B:
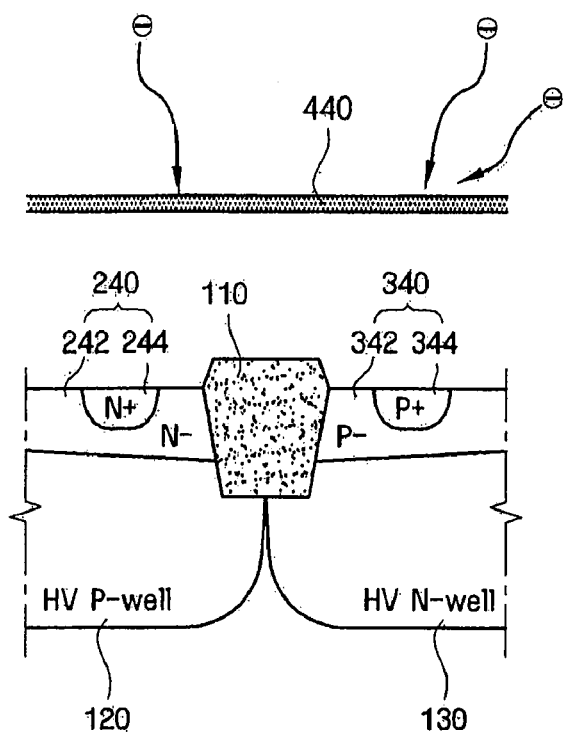

FIGS. 5A and 6B are views that illustrate the effect of the semiconductor integrated circuit device according to the first embodiment of the present invention, in each of which FIGS. 5A and 6A shows a semiconductor integrated circuit without a first VUV blocking layer 440 and FIGS. 5B and 6B shows a semiconductor integrated circuit with a VUV blocking layer 440.

Referring to FIGS. 5A and 5B, in the semiconductor integrated circuit 1 of FIG. 5A, external ions or moisture from a plurality of intermetallic dielectric layers (450 and 480 of FIG. 2) are diffused and thus negative electric charges may be accumulated on the gate insulating layer 310 of the PMOS high voltage driving transistor 300. Once negative electric charges are accumulated on the gate insulating layer 310, negative electric charges are also accumulated, thereby forming an inversion layer 134. In particular, the inversion layer 134 can be easily formed because the N-well 130 of the PMOS high voltage driving transistor 300 has low dopant concentration. Thus, a drain-off current Idoff can be generated without a voltage greater than a threshold voltage being applied to the gate electrode 320.

On the other hand, since external ions or moisture are absorbed by the first VUV blocking layer 440 formed of nitride in FIG. 5B, negative electric charges are not accumulated on the gate insulating layer 310 of the PMOS high voltage driving transistor 300.

Referring to FIG. 6A, external ions or moisture from a plurality of intermetallic dielectric layers (see 450 and 480 of FIG. 2) are diffused and thus negative electric charges may be accumulated on the device isolation layer 110 that electrically isolates the NMOS high voltage driving transistor and the PMOS high voltage driving transistor (see 200 and 300 of FIG. 2). Once negative electric charges are accumulated on the device isolation layer 110, positive electric charges are accumulated on the surfaces of the P-well 120 and the N-well 130 adjacent to the device isolation layer 110. Thus, the inversion layer 134 is formed in the N-well 130 and the accumulation layer 124 in which positive electric charges are accumulated is formed in the P-well 120. The inversion 134 and the accumulation layer 124 can be easily formed because the P-well 120 and the N-well 130 of the NMOS high voltage driving transistor and the PMOS high voltage driving transistor have low dopant concentration. Thus, an isolation current Isol may be formed through the inversion layer 134 between the drain region 340 of the PMOS high voltage driving transistor 300 and the P-well 120 of the NMOS high voltage driving transistor 200. As a result, the isolation between the NMOS high voltage driving transistor 200 and the PMOS high voltage driving transistor 300 is degraded.

On the other hand, in FIG. 6B, since the external ions or moisture are absorbed by the first VUV blocking layer 440 formed of nitride, negative electric charges are not accumulated on the device isolation layer 110 that electrically isolates the NMOS high voltage driving transistor 200 and the PMOS high voltage driving transistor 300. As a result, an isolation current Isol is not generated.

Although only the case where negative electric charges are accumulated on the gate insulating layer 310 and the device isolation layer 110 is described in FIGS. 5 and 6, it is obvious to those skilled in the art that positive electric charges can also be accumulated by a substrate bias voltage applied to a semiconductor substrate. Thus, it is also obvious that a drain-off current Idoff and an isolation current Isol can be generated in the similar manner when positive electric charges are accumulated.

Figure 7:
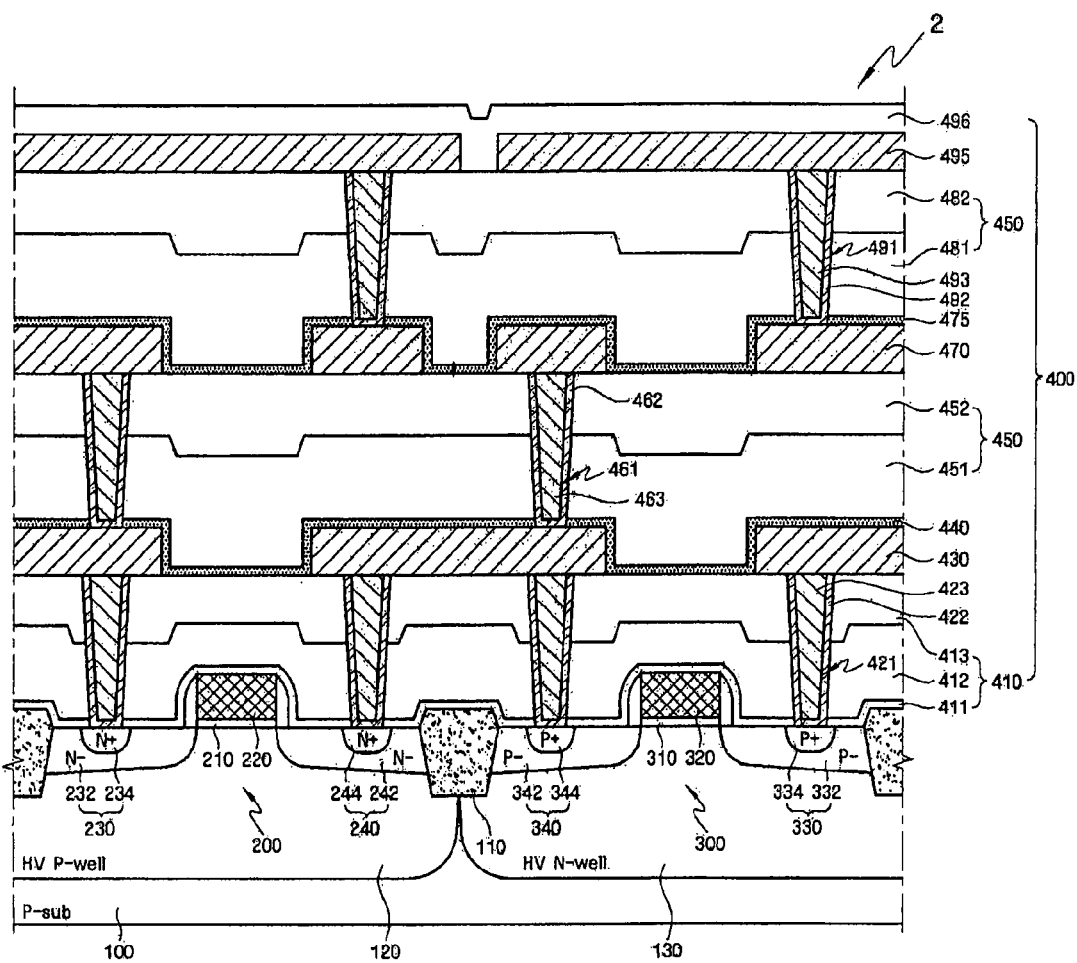
FIG. 7 is a cross-sectional view of a semiconductor integrated circuit device according to a second embodiment of the present invention.

FIG. 7 is a cross-sectional view of a semiconductor integrated circuit device according to a second embodiment of the present invention. Components each having the same function for describing the embodiments shown in FIG. 2 are respectively identified by the same reference numerals, and their repetitive description will be omitted.

Referring to FIG. 7, a semiconductor integrated circuit 2 according to a second embodiment of the present invention is different from the semiconductor integrated circuit 1 according to the first embodiment of the present invention in that a second VUV blocking layer 475 that blocks VUV rays irradiated to the semiconductor substrate 100 is further formed on the entire surface of a second interconnection line 470 and a second intermetallic dielectric layer 480. The second VUV blocking layer 475 blocks the VUV rays irradiated to the semiconductor substrate 100, external ions, and moisture. The first VUV blocking layer 440 is formed of a material having a smaller band gap than silicon oxide ($SiO_x$). For example, the first VUV blocking layer 440 may be, but is not limited to, a SiN layer or a SiON layer as.

Since the first VUV blocking layer 440 and the second VUV blocking layer 475 are formed in the semiconductor integrated circuit device 2 according to the second embodiment of the present invention, the semiconductor integrated circuit device 2 can be superior to the semiconductor integrated circuit device 1 according to a first embodiment of the present invention in terms of blocking VUV rays and absorbing external ions and moisture.

In one embodiment, a VUV blocking layer may be formed only on the entire surface of the second interconnection line 470 and the second intermetallic dielectric layer 480. However, damage may be caused due to VUV rays irradiated during a process of manufacturing the first intermetallic dielectric layer 450 or due to external ions and moisture included in the first intermetallic dielectric layer 450.

Figure 8:
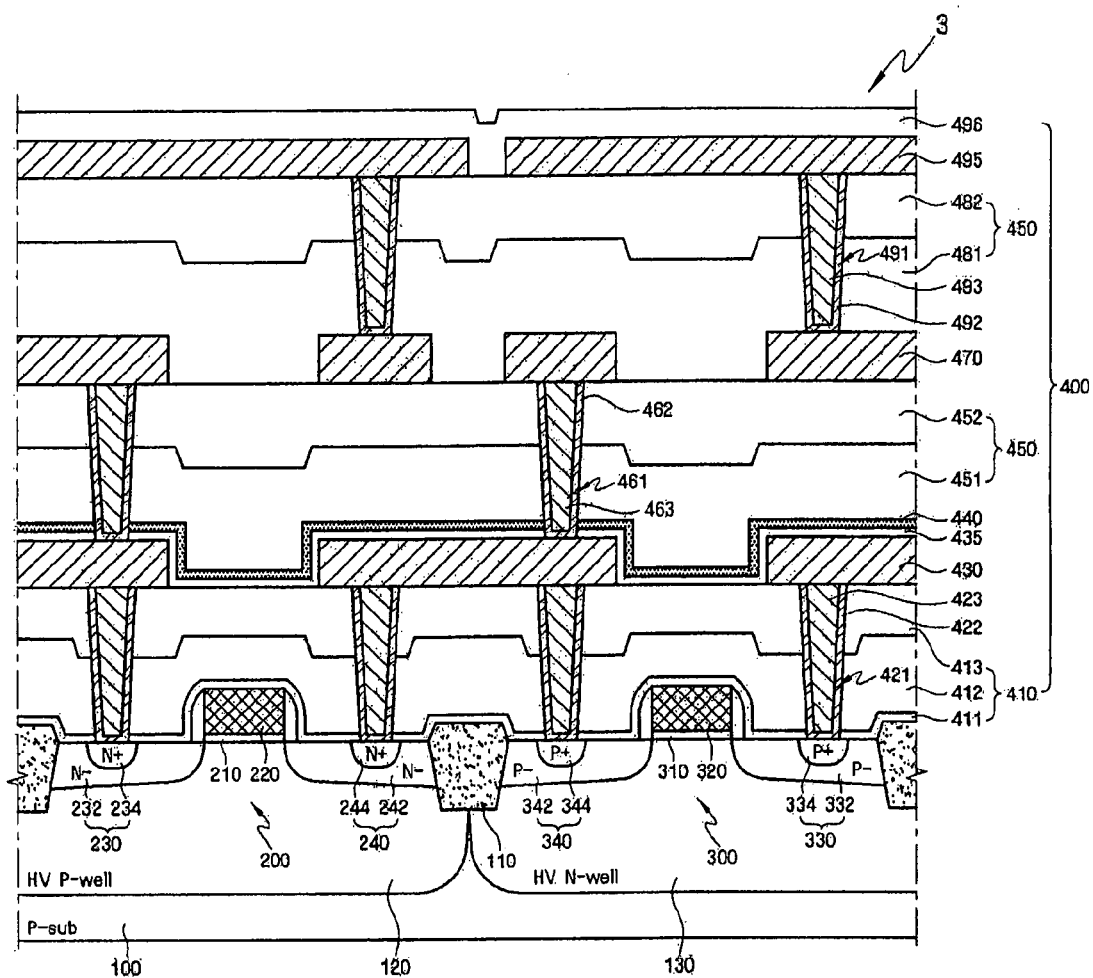
FIG. 8 is a cross-sectional view of a semiconductor integrated circuit device according to a third embodiment of the present invention.

FIG. 8 is a cross-sectional view of a semiconductor integrated circuit device according to a third embodiment of the present invention.

Referring to FIG. 8, a semiconductor integrated circuit 3 according to a third embodiment of the present invention is different from the semiconductor integrated circuit 1 according to the first embodiment of the present invention in that a first oxide layer 435 is further included between the entire surface of the first interconnection line 430 and the interlayer dielectric layer 410 and the first VUV blocking layer 440. The first oxide layer 435 serves as a buffer between the entire surface of the first interconnection line 430 and the interlayer dielectric layer 410 and the first VUV blocking layer 440.

In one embodiment, a second oxide layer and a second VUV blocking layer can be sequentially formed on the entire surface of a first intermetallic dielectric layer and a second interconnection line.

FIGS. 9A through 9F are cross-sectional views illustrating a method for fabricating a semiconductor integrated circuit device according to the present invention.

Figure 9A:
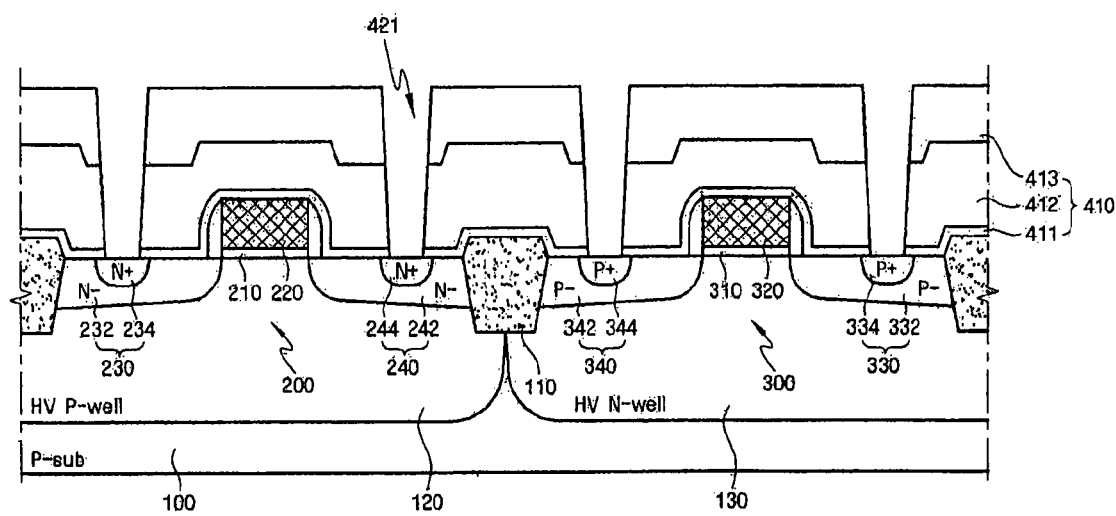
FIGS. 9A through 9F are cross-sectional views that illustrate a method for fabricating a semiconductor integrated circuit device according to the present invention.

Referring to FIG. 9A, the semiconductor substrate 100 is provided. The device isolation layer 110 is formed on the semiconductor substrate 100 to define an active region. The NMOS high voltage driving transistor 200 and the PMOS high voltage driving transistor 300 are formed on the active region.

Next, the interlayer dielectric 410 is formed on the NMOS high voltage driving transistor 200, the PMOS high voltage driving transistor 300, and the semiconductor substrate 100. The interlayer dielectric layer 410 may be formed of a low-k material. In this embodiment of the present invention, the PEOX layer 411, the BPSG layer 412, and the PETEOS layer 413 are sequentially formed.

Next, contact holes 421 that expose the source/drain regions 230 and 240 of the NMOS high voltage driving transistor 200 and the source/drain regions 330 and 340 of the PMOS high voltage driving transistor 300 are formed by performing a typical etching process on the interlayer dielectric layer 410.

Figure 9B:
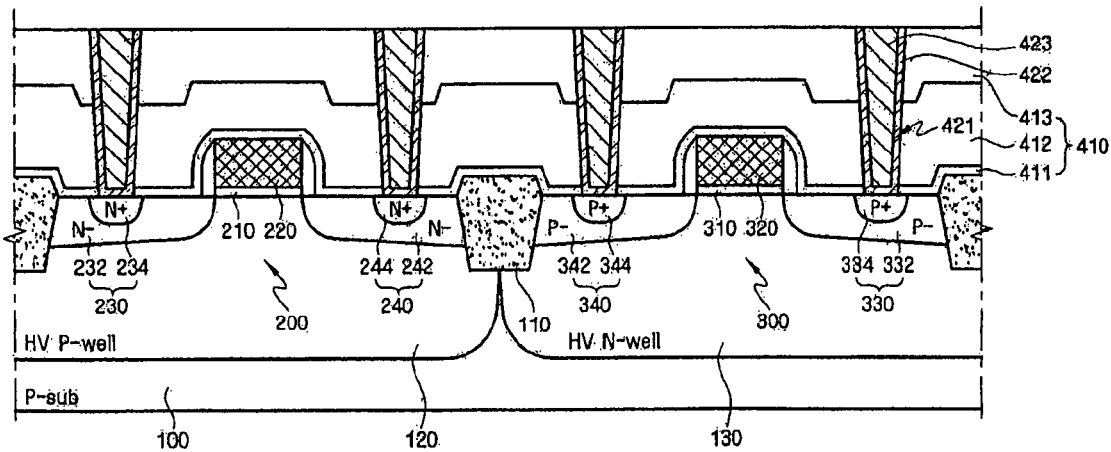

Referring to FIG. 9B, a first barrier layer is conformally formed along the profile of the sides and bottoms of the contact holes 421 and the top of the interlayer dielectric layer 410. The first barrier layer may be formed of Ti, TiN, Ti/TiN, Ta, TaN, Ta/TaN, or Ta/TiN using chemical vapor deposition (CVD) or sputtering.

Next, a metal layer is formed on the first barrier layer 440 by depositing a conductive material such as Cu, Ti, or W to sufficiently fill the contact holes 421. Here, it is preferable that Ti or W be deposited using CVD or sputtering because Cu is likely to be diffused to the interlayer dielectric layer 410.

Next, the metal layer and the first barrier layer 440 are polished using chemical mechanical polishing (CMP) until the surface of the interlayer dielectric layer 410 is exposed, thereby forming a contact 423 that fills the contact holes 421. At this time, the first barrier layer remains at the sidewalls and bottom of the contact 423 as a first barrier layer pattern 422.

Figure 9C:
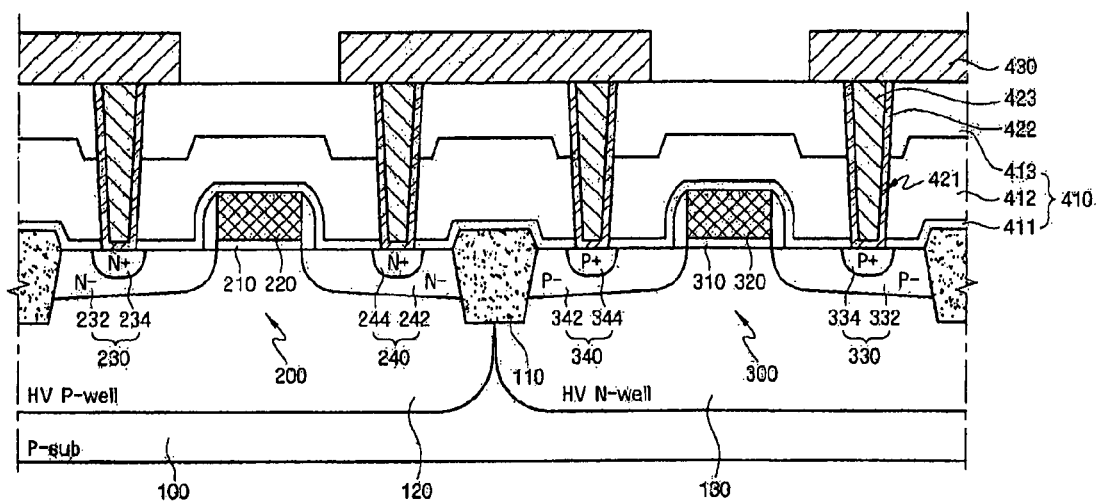

Referring to FIG. 9C, a first interconnection line conductive layer is deposited on the interlayer dielectric layer 410 and is then patterned, thereby forming a first interconnection line 430. Here, aluminum is used for the first interconnection line conductive layer and is deposited using CVD or sputtering.

Although not shown, when the first interconnection line 430 is an aluminum interconnection line, an adhesion film may be further formed of Ti/TiN between the first interconnection line 430 and the contact 423 to improve the adhesion between the first interconnection line 430 and the contact 423, and an anti-reflection coating film may be further formed of Ti, TiN, or Ti/TiN on the first interconnection line 430 to prevent a diffuse reflection of aluminum during a photolithography process.

Figure 9D:
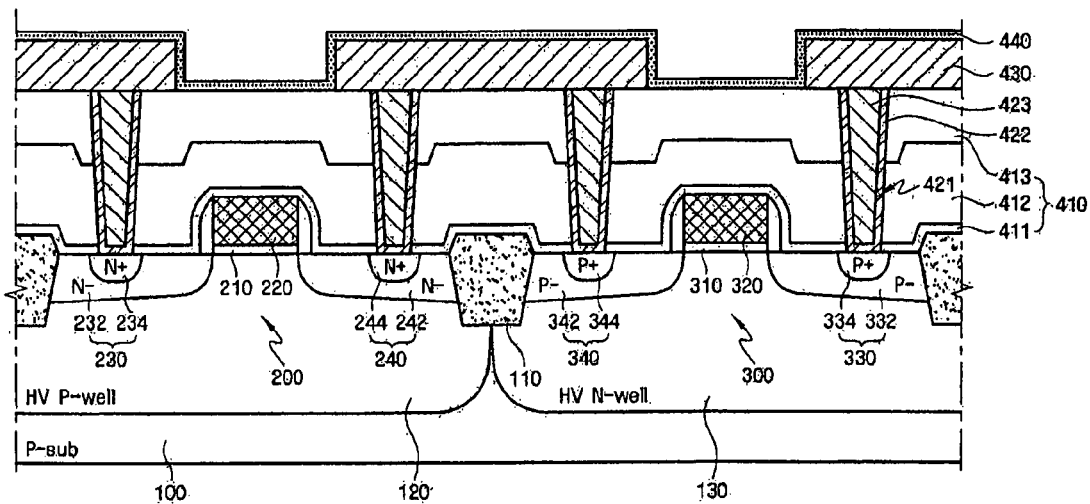

Referring to FIG. 9D, the first VUV blocking layer 440 that blocks VUV rays irradiated to the semiconductor substrate 100 is formed on the entire surface of the first interconnection line 430 and the interlayer dielectric layer 410. For example, the first VUV blocking layer 440 is formed of a material having a smaller band gap than silicon oxide ($SiO_x$) such as nitride. In particular, a SiN layer or a SiON layer may be formed through CVD.

Figure 9E:
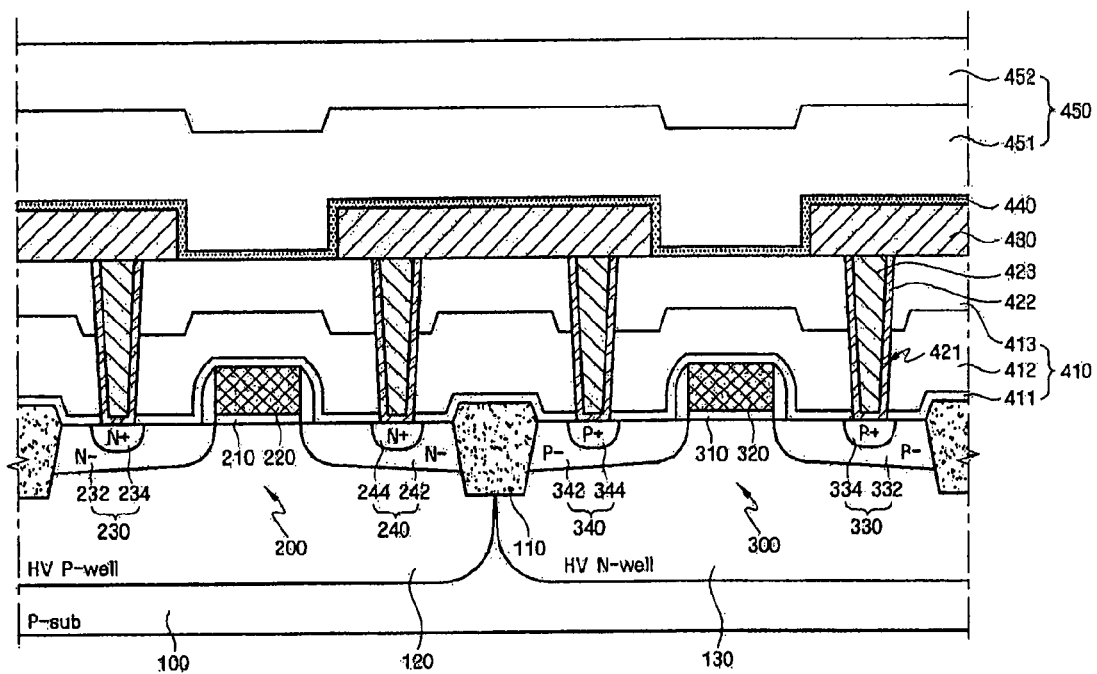

Referring to FIG. 9E, the first intermetallic dielectric layer 450 is formed on the first VUV blocking layer 440. In the first embodiment of the present invention, an HDP layer 451 and a PETEOS layer 452 are sequentially deposited. Here, the HDP layer 451 and the PETEOS layer 452 are formed by plasma deposition. Plasma deposition is advantageous in that deposition can be performed at low temperature. Although VUV rays may be irradiated when using plasma, the first VUV blocking layer 440 absorbs the radiated VUV rays, thereby preventing the semiconductor integrated circuit device 1 from being damaged by the irradiated VUV rays.

Figure 9F:
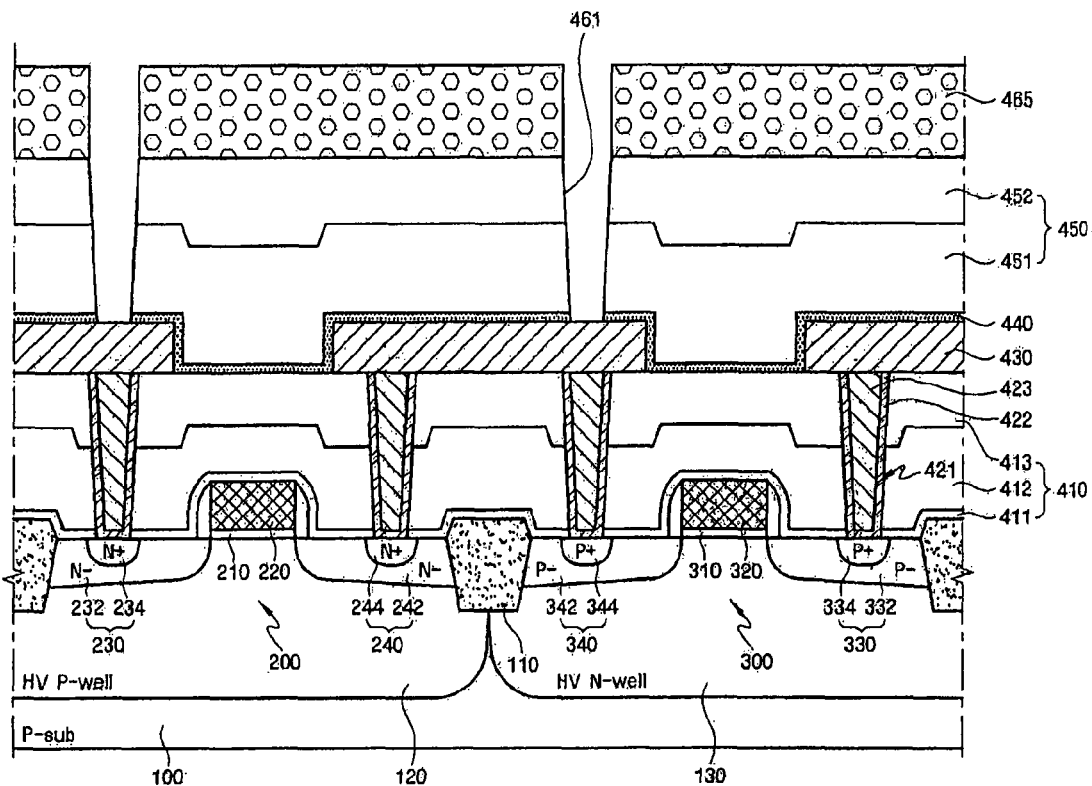

Referring to FIG. 9F, a photoresist pattern 465 is formed on the first intermetallic dielectric layer 450, thereby forming first via holes 461 that expose the first interconnection line 430. Thereafter, the photoresist pattern 465 is removed through an ashing process using high-temperature oxygen plasma. VUV rays may be irradiated when using plasma, but the first VUV blocking layer 440 absorbs the VUV rays and thus prevents the semiconductor integrated circuit 1 from being damaged.

Referring back to FIG. 2, a second barrier layer is conformally formed along the profile of the sides and bottom of the first via holes 461 and the top of the interlayer dielectric layer 410. Next, a metal layer is formed by depositing a conductive material such as Cu, Ti, or W on the first barrier layer to sufficiently fill the first via holes 461. Next, the metal layer and the second barrier layer are polished using CMP until the surface of the first intermetallic dielectric layer 450 is exposed, thereby forming the first via 463 that fills the first via holes 461.

The second interconnection line 470 is formed on the first intermetallic dielectric layer 450. The second intermetallic dielectric layer 480, the second via holes 491, third barrier layer patterns 492, and a second via 493 are formed.

The third interconnection line 495 is formed on the second intermetallic dielectric layer 480 and the passivation layer 496 that protects the semiconductor integrated device 1 is formed on the third interconnection line 495.

While the method of fabricating a semiconductor integrated circuit device according to an embodiment of the present invention has been described, methods of fabricating semiconductor integrated circuit devices according to other embodiments of the present invention can be readily envisioned technologically by those skilled in the art. Thus, an explanation thereof will not be given.

The experimental example described below is for illustrative purposes and other examples and applications can be readily envisioned by a person of ordinary skill in the art.

EXPERIMENTAL EXAMPLE

Figure 10:
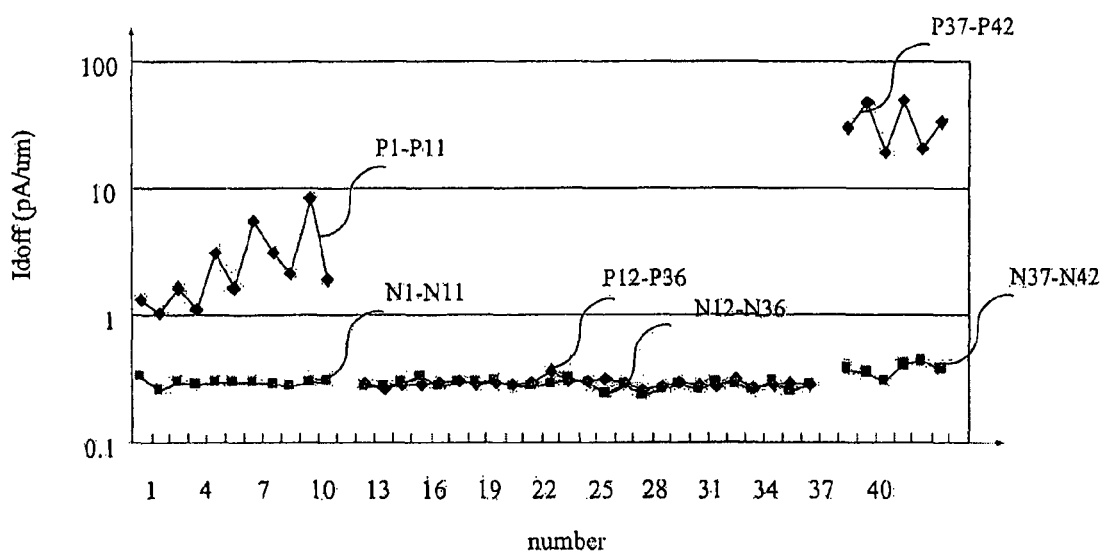
FIG. 10 shows a result of measuring drain-off currents after an NMOS high voltage driving transistor and a PMOS transistor are manufactured and a SiON layer is formed on a first interconnection line of each of the NMOS high voltage driving transistor and the PMOS transistor.

Referring to FIG. 10, after forty-two NMOS high voltage driving transistors and forty-two PMOS high voltage driving transistors, each having a width of 25 μm and a length of 4 μm, are formed, a SiON layer having a thickness of 260 Å is formed on a first interconnection line in each of eleven NMOS high voltage driving transistors, N1 through N11, and eleven PMOS high voltage driving transistors, P1 through P11, a SiON layer having a thickness of 600 Å is formed on a first interconnection line in each of twenty-five NMOS high voltage driving transistors, N12 through N36, and twenty-five PMOS high voltage driving transistors, P12 through P36, and a SiON layer is not formed in a first interconnection line in each of six NMOS high voltage driving transistors, N37 through N42, and six PMOS high voltage driving transistors, P37 through P42.

Next, a drain-off current Idoff of each of the forty-two NMOS high voltage driving transistors and the forty-two PMOS high voltage driving transistors is measured and the results are shown in FIG. 10.

Referring to FIG. 10, the x axis indicates a number of transistors and the y axis indicates a drain-off current Idoff. In the experimental example, negative electric charges are accumulated on a gate insulating layer. Thus, the drain-off current Idoff of the NMOS high voltage driving transistors N1 through N42 is constant at about 0.5 pA/μm. On the other hand, in the PMOS high voltage driving transistors, P1 through P42, the thickness of the SiON layer increases, the drain-off current Idoff decreases. That is, the drain-off current Idoff is about 5 pA/μm in the PMOS high voltage driving transistors, P37 through P42 having no SiON layer, the drain-off current Idoff is about 50 pA/μm in the PMOS high voltage driving transistors P1 through P11 having a SiON layer with a thickness of 260 Å, and the drain-off current Idoff in the PMOS high voltage driving transistors P12 through P36 having a SiON layer of 600 Å is similar to the drain-off current Idoff in the NMOS high voltage driving transistors N1 through N42.

As described above, a semiconductor intergrated circuit device and method for fabricating the same according to the present invention provides at least the following advantages.

First, a VUV blocking layer prevents VUV rays from being irradiated to a semiconductor substrate and external ions or moisture from penetrating the semiconductor substrate.

Second, by reducing a leakage current such as a drain-off current Idoff and an isolation current Isol, the operating characteristic of a semiconductor integrated circuit can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims. Therefore, it is to be understood that the above-described embodiments have been provided only in a descriptive sense and will not be construed as placing any limitation on the scope of the invention.

What is claimed is:

1. A method for fabricating a semiconductor integrated circuit, comprising:
    forming a first conductive layer pattern on a semiconductor substrate including a first dopant, the first conductive layer pattern being a gate electrode of a high voltage driving transistor;
    forming an interlayer dielectric layer on the first conductive layer pattern;
    forming a second conductive layer pattern on the interlayer dielectric layer;
    forming a first vacuum ultraviolet (VUV) blocking layer having an insulating property conformally on the second conductive layer pattern and the interlayer dielectric layer to block a VUV ray irradiated to the semiconductor substrate, and
    forming an intermetallic dielectric layer on the first VUV blocking layer through plasma deposition.

2. The method for fabricating a semiconductor integrated circuit of claim 1, further comprising forming a first oxide layer under the first VUV blocking layer.

3. The method for fabricating a semiconductor integrated circuit of claim 1, wherein the first VUV blocking layer is formed of a material having a smaller band gap than silicon oxide.

4. The method for fabricating a semiconductor integrated circuit of claim 3, wherein the first VUV blocking layer comprises nitride.

5. The method for fabricating a semiconductor integrated circuit of claim 3, wherein the first VUV blocking layer is a SiN layer or a SiON layer.

6. The method for fabricating a semiconductor integrated circuit of claim 1, wherein the high voltage driving transistor includes source/drain regions which are comprised of a lightly doped region including a second dopant and a highly doped region, the lightly doped region being arranged at the gate electrode, formed in the semiconductor substrate and being of a different conductivity type from the semiconductor substrate and the highly doped region spaced a predetermined interval apart from the gate electrode, formed shallower than the lightly doped region, and being of a different conductivity type from the semiconductor substrate.

7. The method for fabricating a semiconductor integrated circuit of claim 6, wherein the dopant concentration of the first dopant is in a range of $1\times10^{15}$-$1\times10^{17}$ atoms/cm$^3$.

8. The method for fabricating a semiconductor integrated circuit of claim 6, wherein the dopant concentration of the second dopant is in a range of $1\times10^{14}$-$1\times10^{16}$ atoms/cm$^3$.

9. The method for fabricating a semiconductor integrated circuit of claim 1, wherein the forming of the intermetallic dielectric layer includes sequentially forming a first dielectric layer and a second dielectric layer, the first dielectric layer having better gap-fill characteristic than the second dielectric layer.

10. The method for fabricating a semiconductor integrated circuit of claim 9, further comprising forming a third conductive layer pattern on the intermetallic dielectric layer and a second VUV blocking layer on the surface of the third conductive layer pattern and the intermetallic dielectric layer to block the VUV ray irradiated to the semiconductor substrate, after forming the intermetallic dielectric layer.

11. The method for fabricating a semiconductor integrated circuit of claim 10, further comprising forming a second oxide layer on the surface of the third conductive layer pattern and the intermetallic dielectric layer before forming the second VUV blocking layer.

12. The method for fabricating a semiconductor integrated circuit of claim 10, wherein the second VUV blocking layer is formed of a material having a smaller band gap than silicon oxide.

13. A method for fabricating a semiconductor integrated circuit, comprising:
    forming a first conductive layer pattern on a semiconductor substrate including a first dopant, the first conductive layer pattern being a gate electrode of a high voltage driving transistor;
    forming an interlayer dielectric layer on the first conductive layer pattern;
    forming a second conductive layer pattern on the interlayer dielectric layer;
    forming a first vacuum ultraviolet (VUV) blocking layer having an insulating property conformally on the second conductive layer pattern and the interlayer dielectric layer to block a VUV ray irradiated to the semiconductor substrate;

forming an intermetallic dielectric layer on the first VUV blocking layer through plasma deposition; and applying a driving voltage greater than or equal to 15 volts to the high voltage driving transistor.

14. A method for fabricating a semiconductor integrated circuit, comprising:

forming a first conductive layer pattern on a semiconductor substrate including a first dopant, the first conductive layer pattern being a gate electrode of a high voltage driving transistor;

forming an interlayer dielectric layer on the first conductive layer pattern;

forming a second conductive layer pattern on the interlayer dielectric layer;

forming a first vacuum ultraviolet (VUV) blocking layer on the surface of the second conductive layer pattern and the interlayer dielectric layer to block a VUV ray irradiated to the semiconductor substrate, and forming an intermetallic dielectric layer on the first VUV blocking layer.

* * * * *